United States Patent [19]

Tseng

[11] Patent Number: 5,783,486
[45] Date of Patent: Jul. 21, 1998

[54] BRIDGE-FREE SELF ALIGNED SILICIDE PROCESS

[75] Inventor: Horng-Huei Tseng, Hsinchu, Taiwan

[73] Assignee: Vanguard International Semiconductor Corporation, Hsin-Chu, Taiwan

[21] Appl. No.: 734,066

[22] Filed: Oct. 18, 1996

[51] Int. Cl.⁶ .................................................. H01L 21/44
[52] U.S. Cl. .......................... 438/682; 438/230; 438/649; 438/651; 438/655
[58] Field of Search ............................ 437/200; 438/217, 438/222, 224, 230, 682, 649, 651, 655

[56] References Cited

U.S. PATENT DOCUMENTS

| | | | |
|---|---|---|---|
| 4,786,609 | 11/1988 | Chen | 437/30 |
| 4,818,715 | 4/1989 | Chao | 437/44 |
| 4,885,259 | 12/1989 | Osinski et al. | 437/41 |
| 5,168,072 | 12/1992 | Moslehi | 437/41 |
| 5,612,240 | 3/1997 | Chang | 437/44 |
| 5,627,097 | 5/1997 | Venkatesan et al. | 438/217 |

*Primary Examiner*—Charles L. Bowers, Jr.
*Assistant Examiner*—Reneé R. Berry
*Attorney, Agent, or Firm*—George O. Saile; Stephen B. Ackerman; William J. Stoffel

[57] ABSTRACT

A method of forming a transistor having silicide contacts to the gate and source/drain regions. A semiconductor substrate is provided having spaced field oxide regions and active areas. On the active areas, a gate structure is formed having a gate oxide, gate, and gate insulating layer. In an important step, the gate 18 is laterally etched to remove a first width of the gate. A second dielectric layer 22 composed of oxide is deposited over the sidewalls of the gate, the gate 18 and the substrate 10. The second dielectric layer 22 is etched forming sidewall spacers 24 on the sidewalls of the gate 18, the gate insulating layer 20, and the gate oxide layer. The gate insulating layer 20 is then removed with a selective etch. A metal layer 30 is deposited over the resulting surface. The metal layer 30 is heat treated forming a gate silicide contact 36 on the gate 18 and source and drain silicide contacts 34 on the active areas. The unreacted metal over the sidewall spacers and the field oxide regions is then removed with a selective etch. Impurity ions are implanted into the active areas forming source and drain regions 40 under the source and drain silicide contacts.

21 Claims, 2 Drawing Sheets ized by the large source/drain series resistance.

5,783,486

1

BRIDGE-FREE SELF ALIGNED SILICIDE PROCESS

BACKGROUND OF INVENTION

1. Field of the Invention

This invention relates generally to the fabrication of a semiconductor device that employs electrically insulating sidewall spacers to control device characteristics and more particularly to a bridge free self aligned silicide process.

2. Description of the Prior Art

The self-aligned silicide or salicide process has two important features. The salicide process uses the gate electrode as a mask during ion implantation of the source and drain regions of a field effect transistor (FET). Also, metal silicide contacts are formed to the source/drain and gate regions by a selective silicide process which rises gate dielectric spacers as masks to prevent silicide from forming on the gates.

The self-aligned silicide or salicide process can be described as follows. An insulated-gate field-effect transistor (FET) made from a body of monocrystalline silicon according to state-of-the-art semiconductor processing techniques visually consists of a conductivity doped polycrystalline silicon (polysilicon) gate electrode a thin gate dielectric lying tinder the gate electrode and a pair of source/drain (S/T)) regions formed in the semiconductor body. The S/D regions are separated from each other by a channel region that lies below the gate dielectric.

The source/drain (S/D) regions are typically created by ion implantation in which the gate electrode is used as a shield to prevent implantation into the channel. At the end of the implantation, the sides of the gate electrode are in substantial vertical alignment with the inside boundaries of the source/drain regions However lateral diffusion of the implanted dopant during subsequent heating steps causes the gate electrode to partially overlap the source/drain regions in the final FET. The overlap causes a loss in effective channel length and a loss in FET speed.

One technique for controlling the vertical alignment is to form insulating spacers along the sidewalls of the gate electrode before performing the ion implantation to define the source/drain regions The sidewall spacers then act as a further implantation shield during the source/drain implantation. This increases the initial lateral separation between the source/drain regions, thereby substantially reducing undesirable overlap of the gate electrode to the source/drain regions.

A difficulty caused by scaling down is the increase in the resistance of diffused layers. This results in increased signal delays along diffused interconnects and degrades circuit performance due to the large source/drain series resistance.

To alleviate the high electric field at the reduced MOSFET channel length lightly doped drain (LDD) devices have been proposed. In the LDD structure, narrow, self-aligned, N– regions are introduced between the channel and the N+ source/drain regions. The N– regions spreads the high electric field out near the drain junction allowing the device to be operated at a higher supply voltage with fewer hot-electron problems.

Several processes for fabrication lightly-doped drain field effect transistor (LDDFET) have been proposed. Spacer and overhang techniques are most commonly adopted. The spacer technique involves a reactive-ion etching (RIE) step after silicon dioxide by a chemical vapor deposition process (CVD) to form sidewall oxide spacers. Oxide spacers are used to mask the heavy and deep implant of the N+ source/drain regions after the formation of the shallow N– source/drain regions.

In the salicide process, high quality ohmic contacts are formed to the source, drain and gate. This is accomplished by simultaneous coating all relevant surfaces with a layer of refectory metal such as Titanium and then heating for a short time. This enables the refectory metal to react with the underlying silicon to form a thin layer of silicide, stitch as titanium silicide. Unreacted refectory metal is then removed by etching and a second heat treatment is provided to lower the sheet resistance in the source, drain, and gate regions.

The two heat treatments described above usually are performed using a rapid thermal anneal (RTA). In a RTA, the material is brought to a relatively high temperature as quickly as possible, held then for a relatively short time, and then cooled down as quickly as possible. RTA as opposed to slower heat treatments, is needed to try to minimize the diffusion of dopants already present in the device into less than optimal locations and/or concentration. However especially when the high concentration source and drains are present, RTA heat treatment does diffuse source/drain dopant impurity ions into less favorable locations and concentrations. This slows down the transistors. Additionally if the RTA temperature is too low, the silicide will end up with too high a sheet resistance.

Other practitioners have tried to improve the process for forming silicide contacts to a transistor. U.S. Pat. No. 4,885,259 (Osinski et al) forms source and drain regions in a substrate followed by a metal silicide process including an anneal. The anneal can drive in the impurities from the source and drain regions, thus making the source and drain regions deeper. This can slow down the transistor. Also, the gate has a high contact resistance.

U.S. Pat. No. 4,818,715 (Chao) shows a method of fabricating a LDDFET with self aligned silicide contacts. However, Chao's gate, source and drain regions are implanted and then metal silicide contacts are made. Again the metal silicide anneal heat process drives in the already present S/D doped regions thus slowing the transistor.

U.S. Pat. No. 4,786,609 (Chen) teaches a method of forming FET's using gate sidewall spacers. Chen forms S/D regions while the gate is covered by an implant barrier layer. This process can be improved by increasing the conductivity of the gate and using a salicide process.

SUMMARY OF THE INVENTION

It is an object of the present invention to provide a method for fabricating bridge free self aligned silicide contacts to a transistor.

It is another object of the present invention to provide a method for forming highly doped source and drain regions after silicide contact to the source and drain regions have been formed.

To accomplish the above objectives, the present invention provides a method of forming a transistor having silicide contacts to gate, source and drain regions in a substrate 10. The method begins by providing a semiconductor substrate 10 having spaced field oxide regions 14 and active areas. A gate oxide layer 16 is formed on the active areas on the semiconductor substrate 10. A polysilicon layer is form over the gate oxide layer 16. A first dielectric layer 20 composed of silicon nitride is formed over the polysilicon layer. The polysilicon layer and the first dielectric layer 20 are patterned to form a gate 18 and a gate insulating layer. The gate 18 is laterally etched to remove a first width of the gate. The first width has a range of between about 0.05 and 0.15 μm. A second dielectric layer 22 composed of oxide deposited over the sidewalls of the gate, insulating layer 20 and the substrate 10. The second dielectric layer 22 is anisotropically etched to form sidewall spacers 24 on the sidewalls of the gate 18. The gate insulating layer 20 is removed. A metal layer 30 is deposited over the resulting surface. The metal layer 30 is heat treated forming a gate silicide contact 36 on the gate 18, and source and drain silicide contacts 34 on the active areas and leaving unreacted metal layer over the sidewall spacers 24. The unreacted metal layer over the sidewall spacers 24 and the field oxide regions 14 is removed. The active areas are implanted using the gate 18 as an ion implant barrier forming source and drain regions 40 under the source and drain silicide contacts 34.

This invention provides many benefits over conventional processes. A mayor advantage of the invention is the sidewall spacers 24 that extend above the tops the gate 18. The extended spacers extend the distance between the source/drain silicide and the gate silicide thereby eliminating the shorting between the gate and substrate silicide contacts (e.g., stingers). Also, the invention forms shallower gate, source and drain regions because the gate, source and drain implant is performed after the silicide anneal. The shallower gate, source and drain regions provide faster transistor device circuits. The idea can be used for NMOS, PMOS and CMOS. In addition, the top of the gate is implanted along with the source/drain regions. The implant lowers the gate contact resistance thereby producing a faster device.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention provides a method of forming bridge free self aligned silicide contacts to a transistor. The present invention will be described in detail with reference to the accompanying drawings. The term "substrate" is meant to include devices formed within a semiconductor wafer, such as doped regions, and the layers overlying the wafer, stitch as insulation and conductive layer.

Figure 1:
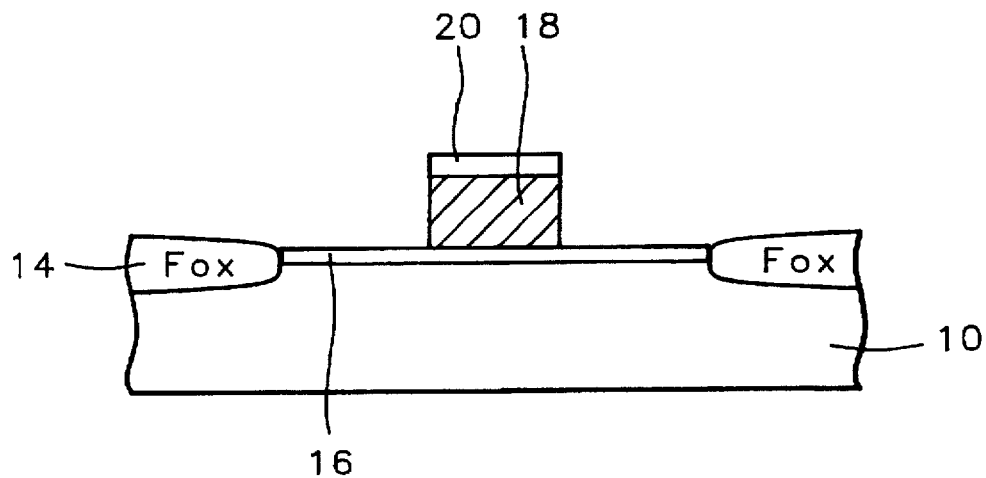
FIGS. 1 through 6 are cross sectional views for illustrating a method for forming bridge free self aligned silicide contacts to a transistor according to present invention.

To accomplish the above objectives the present invention provides a method of forming a transistor having silicide contacts to gate, source and drain regions in a substrate 10. As shown in FIG. 1, a semiconductor structure (e.g., silicon substrate) 10 having spaced field oxide regions 14 and active areas is provided. The substrate is preferably formed of silicon having a crystal orientation of (100). Substrate 10 is understood to possibly include a silicon semiconductor wafer, active and passive devices formed within the wafer. The term "semiconductor structure" is mean to include devices formed within a semiconductor wafer (e.g., sources drain, wells, etc ) and the layers overlying the wafer, such as conductive and insulating layers (eg. oxide and polysilicon layers) . The term "substrate surface" is meant to include the upper most exposed layers on a semiconductor wafer, stitch as a silicon surface, an insulating layer and metallurgy lines. The substrate is a product of processes.

Field oxide regions 14 are formed on the substrate surface. The areas between the field oxide regions are active regions where semiconductor devices will be formed. One method of forming the field oxide regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions.

As shown in FIG. 1, a gate oxide layer 16 is formed on the active areas on the semiconductor substrate 10. The gate oxide layer preferably has a thickness in a range of between about 50 and 200 Å. The gate oxide layer is preferably formed by a thermal oxidation process.

A polysilicon layer is then formed over the gate oxide layer 16. The polysilicon layer preferably has a thickness in a range of between about 2000 and 4000 Å. The polysilicon layer can be deposited by pyrolyzing silane in a low pressure chemical vapor deposition process at a temperature of less than 600° C. The polysilicon layer is preferably doped with an type impurity with a concentration in a range of between about 1E19 and 1E21 atoms/cm$^3$. The polysilicon layer can be doped insitu or implanted or doped with a POCl$_3$ layer. The polysilicon layer can be doped by ion implanting with phosphorous or arsenic ions at a dosage between about 5E15 and 2E16 atoms/sq-cm and an energy of between about 20 and 60 Kev., or is doped with phosphoris oxychloride (POCl$_3$) at a temperature of between about 875° and 900° C., for between about 30 and 50 minutes.

A first dielectric layer 20 is formed over the polysilicon layer. The first dielectric layer 22 is preferably composed of silicon nitride. The first dielectric layer composed of silicon nitride can be formed by reacting silane and ammonia at atmospheric pressure at 700° to 900° C., or by reacting dichlorosilane and ammonia at reduced pressure at approximately 700° C. Also silicon nitride can be formed by plasma enhance chemical vapor deposition by reacting silane with ammonia or nitrogen in a glow discharge between 200° and 350° C. The first dielectric layer 20 preferably has a thickness in a range of between about 800 and 2000 Å.

As shown in FIG. 1, the polysilicon layer and the first dielectric layer 20 are patterned to form a gate 18 and a gate insulating layer 20. The polysilicon layer and the first dielectric layer 20 can be pattern using conventional photolithography and etching techniques.

Figure 2:
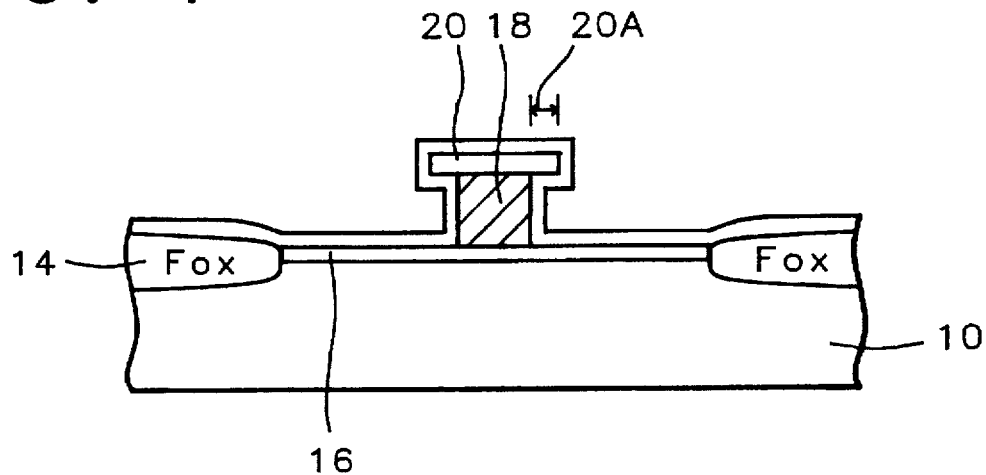

In an important step, as shown in FIG. 2, the gate 18 is laterally etched to remove a first width 20A of the gate 18. The gate 18 is preferably laterally etched with SF$_6$/O$_2$ gas plasma. The first width 20A has a range of about 0.05 and 0.15 μm.

As shown in FIG. 2, a second dielectric layer 22 is deposited over the sidewalls of the gate, insulating layer 20 and the substrate 10. The second dielectric layer 22 is preferably composed of silicon oxide. The second dielectric layer composed of silicon oxide is preferably formed by a Tetraethylorthosilicate (TEOS) process. The second dielectric layer 22 preferably has a thickness in a range of between about 300 and 1200 Å. It is important that the first dielectric 20 and second dielectric 22 layers are formed of materials that have different etch characteristics.

Figure 3:
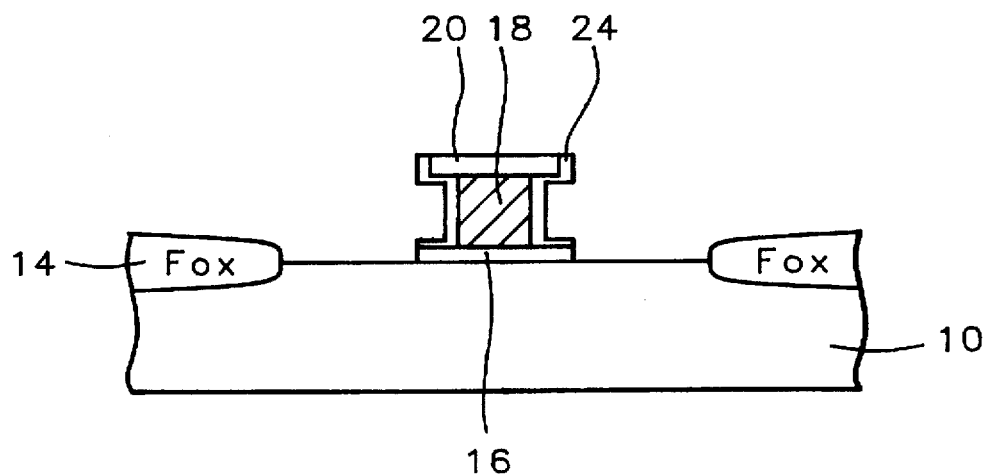

As shown in FIG. 3, the second dielectric layer 22 is anisotropically etched to form sidewall spacers 24 on the sidewalls of the gate 18. The anisotropic etch is selective to the material of the second dielectric layer (e.g., silicon oxide). The gate oxide layer 16 is also anisotropically etched. Preferably a $CF_4 \cdot CHF_3$, Argon, and $O_2$ gas plasma RIE etch is used.

Figure 4:
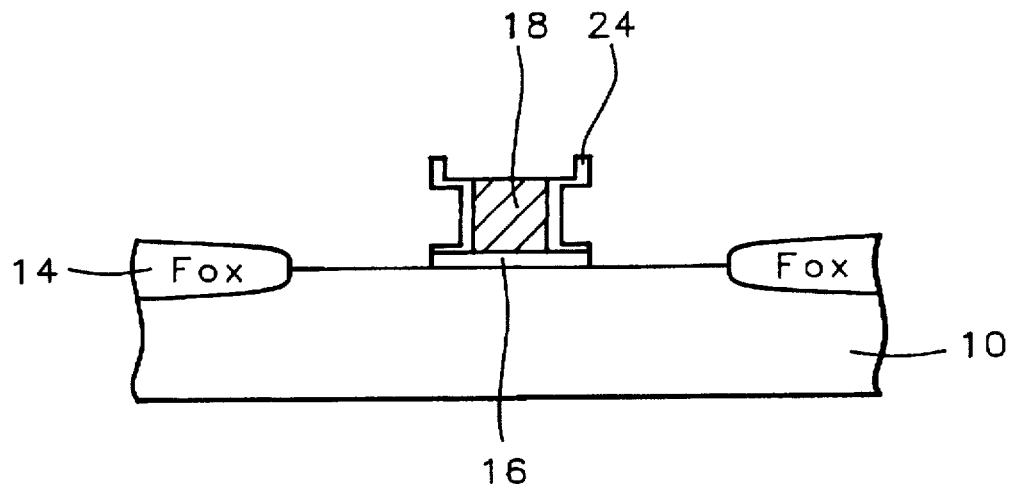

As shown in FIG. 4, the gate insulating layer 20 over the gate is removed exposing inner portions of the top of the gate 18. The gate insulating layer is preferably removed using an etch selective to the material of the gate insulating layer 20, (e.g., silicon nitride). The gate insulating layer is preferably removed using a hot $H_3PO_4$ etch. After the gate insulating layer is removed, the sidewall spacers 24 still extend out away from the gate 18 as shown in FIG. 4. The sidewall spacers 24 also extend above the gate 18 a height about the thickness of the gate insulating layer 20 as shown in FIGS. 3 and 4. The spacers 24 also extend horizontally out from the gate 18 a distance of the width 20a (the width of the gate 18 that was laterally etched away). Note that by removing the gate insulating layer 20 here, gate silicide contacts can be formed. A subsequent gate ion implant can be made through the gate silicide contact as explained below.

Figure 5:
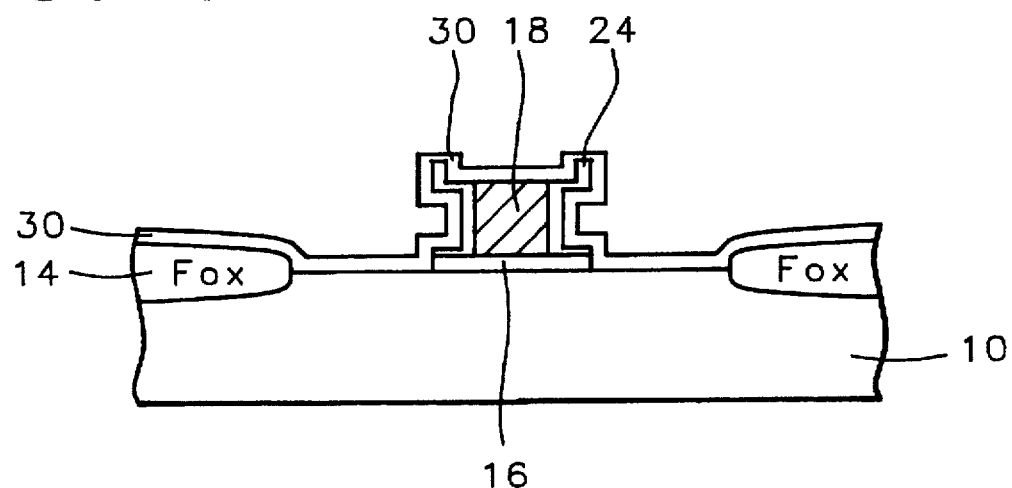

As shown in FIG. 5, a metal layer 30 is deposited over the resulting surface. The metal layer 22 is preferably composed of titanium (Ti), tantalum (Ta) or tungsten (W), and is more preferably titanium. The metal layer 310 preferably has a thickness in the range of between about 200 and 800 Å.

The metal layer 30 is heat treated (annealed) forming a gate silicide contact 36 on the gate 18, and source and drain silicide contacts 34 on the active areas and leaving unreacted metal over the sidewall spacers 24. The anneal can comprise heating at a temperature in a range of between about 650° and 750° C. for a time in a range of between about 20 and 50 minutes.

The gate silicide contact 36 and the source and drain silicide contacts 34 can be composed titanium silicide, tantalum silicide and tungsten silicide. The gate silicide contact 36 and the source and drain silicide contacts 34 preferably have a thickness in the range of between about 400 and 1000 Å.

The structure is now subjected to a rapid thermal anneal (RTA). Typically the RTA at this stage was at a temperature between 650° and 700° C. for 30 to 50 seconds. During the RTA, the metal (e.g., titanium) reacted with all silicon surfaces with which it was in contact, but not with any oxide or nitride surfaces such as the sidewall spacers, to form an interface layer 34 of metal silicide.

Figure 6:
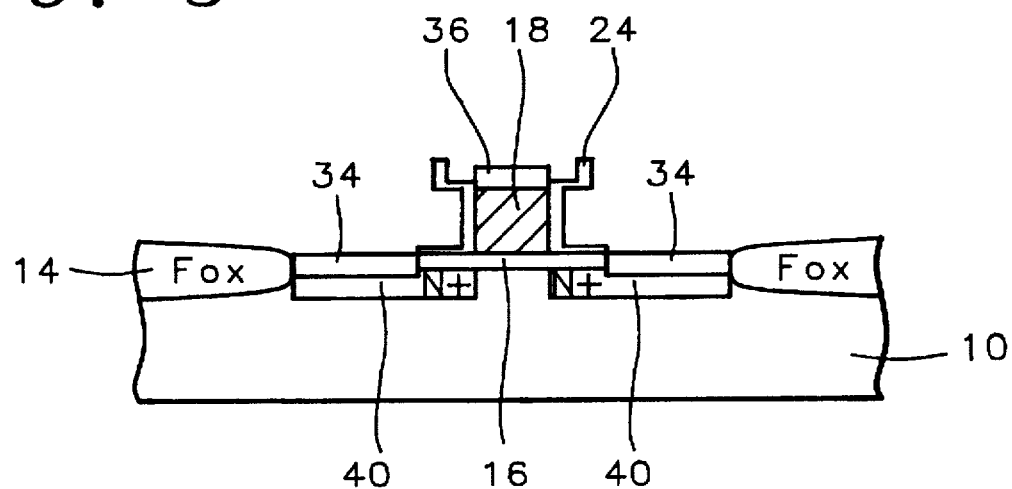

As shown in FIG. 6, the unreacted metal, especially over the sidewall spacers 24 and the field oxide regions 14 is removed. The unreacted metal layer can be removed using an wet etch. The metal layer is preferably removed by etching in an aqueous solution of ammonium hydroxide and hydrogen peroxide to remove any unreacted titanium while leaving the newly formed titanium silicide layer 34 in place.

The active areas are implanted using the gate 18 as an ion implant barrier forming source and drain regions 40 under the source and drain silicide contacts 34. The source and drain regions 26 is preferably formed by ion implanting arsenic ions into the substrate at an energy in the range of between about 40 and 120 keV and a dosage in the range of between about 1E15 and 1E16 atoms/cm². Also, The implant also implants impurities in the gate 18.

This implant step implants through the metal silicide (titanium silicide) contacts 34 36. Also, the ion implant is after the silicide RTA so the source/drain regions are not driven in. Compared to standard ion implant and silicide contacts, has the advantages of a shallower junction and less silicon defects (surface).

This invention provides many benefits over conventional processes. The extended sidewall spacer 24 which covers a portion of the gate eliminates silicide bridging (stringers) between the gate contact 36 and the source/drain regions 34. The longer leakage path decreases leakage currents and improves yields. The invention forms shallower gate, source and drain (doped) regions because the highly doped gate, source and drain implant is performed after the silicide anneal (RTA). The shallower gate, source and drain regions provide faster transistor device circuits.

The high sidewall spacer 24 are an advantage because they will prevent bridging by providing a longer path for stringer to cover between the gate 18 and source/drain regions 34. Another advantage of this invention is that the gate is implanted during the source and drain implants. This increases the conductivity of the gate which improves device performance. The invention can be used for NMOS, PMOS and CMOS type devices.

While the invention has been particularly shown and described with reference to the preferred embodiments thereof, it will be understood by those skilled in the art that various changes in form and details may be made without departing from the spirit and scope of the invention.

What is claimed is:

1. A method of forming a transistor having silicide contacts to gate, source and drain regions in a semiconductor structure comprising:
   a) providing a semiconductor structure having spaced field oxide regions and active areas;
   b) forming a gate structure on the active areas, said gate structure comprising a gate oxide, a gate and a gate insulating layer;
   c) laterally etching said gate to remove a first width of said gate, said gate and said gate insulating layer having sidewalls;
   d) depositing a second dielectric layer over said sidewalls of said gate, and insulating layer and over said substrate;
   e) anisotropically etching said second dielectric layer forming sidewall spacers on the sidewalls of said gate and said gate insulating layer; said sidewall spacers extending above said gate;
   f) removing said gate insulating layer; said sidewall spacers extending above said gate and extending horizontally out from said gate a distance of said first width;
   g) depositing a metal layer over the resulting surface;
   h) heat treating said metal layer forming a gate silicide contact on said gate, and source and drain silicide contacts on said active areas and leaving unreacted metal over said sidewall spacers;
   i) removing said unreacted metal over said sidewall spacers and said field oxide regions; and
   j) implanting impurity ions in said active areas using said gate as an ion implant barrier forming source and drain regions under said source and drain silicide contacts and doping said gate.

2. The method of claim 1 wherein said first width has a range of between about 0.05 and 0.15 μm.

3. The method of claim 1 wherein said gate insulating layer is composed of silicon nitride and has a thickness in a range of between about 800 and 2000 Å.

4. The method of claim 1 wherein said second dielectric layer is composed of oxide and has a thickness in a range of between about 300 and 1200 Å.

5. The method of claim 1 wherein said metal layer is composed of a material selected from the group consisting of: titanium, tantalum, and tungsten, and has a thickness in the range of between about 200 and 800 Å.

6. The method of claim 1 wherein said gate silicide contact and said source and drain silicide contacts are composed of a material selected from the group consisting of: titanium silicide tantalum silicide, and tungsten silicide, and have a thickness in the range of between about 400 and 1000 Å.

7. The method of claim 1 wherein said source and drain regions is formed by ion implanting arsenic ions into said substrate at an energy in the range of between about 40 and 120 keV and a dosage in the range of between about 1E15 and 1E16 atoms/cm$^2$.

8. A method of forming a transistor having silicide contacts to gate, source and drain regions in a substrate comprising:

a) providing a semiconductor substrate having spaced field oxide regions and active areas;

b) forming a gate oxide layer on said active areas on said semiconductor substrate;

c) forming a polysilicon layer on said gate oxide layer;

d) forming a first dielectric layer composed of silicon nitride over said polysilicon layer;

e) patterning said polysilicon layer and said first dielectric layer to form a gate and a gate insulating layer; said gate having a top;

f) laterally etching said gate to remove a first width of said gate, said gate and said gate insulating layer having sidewalls;

g) depositing a second dielectric layer composed of oxide over said sidewalls of said gate, and insulating layer and over said substrate;

h) anisotropically etching said second dielectric layer forming sidewall spacers on the sidewalls of said gate and said gate insulating layer; said gate insulating layer having a first thickness;

i) removing said gate insulating layer; said sidewall spacers extending above said gate a height of said first thickness; and said sidewall spacers extending horizontally out from said gate a distance of said first width;

j) depositing a metal layer over the resulting surface;

k) heat treating said metal layer forming a gate silicide contact on said gate, and source and drain silicide contacts on said active areas and leaving unreacted metal over said sidewall spacers;

l) removing said unreacted metal over said sidewall spacers and said field oxide regions; and m) implanting impurity ions in said active areas using said gate as an ion implant barrier forming source and drain regions under said source and drain silicide contacts and doping said top of said gate.

9. The method of claim 8 wherein said first width has a range of between about 0.05 and 0.15 μm.

10. The method of claim 8 wherein said first dielectric layer has a thickness in a range of between about 800 and 2000 Å.

11. The method of claim 8 wherein said second dielectric layer has a thickness in a range of between about 300 and 1200 Å.

12. The method of claim 8 wherein said metal layer is composed of a material selected from the group consisting of: titanium, tantalum, and tungsten, and has a thickness in the range of between about 200 and 800 Å.

13. The method of claim 8 wherein said gate silicide contact and said source and drain silicide contacts are composed of a material selected from the group consisting of: titanium silicide tantalum silicide, and tungsten silicide, and have a thickness in the range of between about 400 and 1000 Å.

14. The method of claim 8 wherein said source and drain regions are formed by ion implanting arsenic ions into said substrate at an energy in the range of between about 40 and 120 keV and a dosage in the range of between about 1E15 and 1E16 atoms/cm$^2$.

15. A method of forming a transistor having silicide contacts to gate, source and drain regions in a substrate comprising:

a) providing a semiconductor substrate having spaced field oxide regions and active areas;

b) forming a gate oxide layer on said active areas on said semiconductor substrate;

c) forming a polysilicon layer on said gate oxide layer;

d) forming a first dielectric layer composed of silicon nitride over said polysilicon layer; said first dielectric layer having a thickness in a range of between about 800 and 2000 Å, e) patterning said polysilicon layer and said first dielectric layer to form a gate and a gate insulating layer; said gate having a top;

f) laterally etching said gate to remove a first width of said gate, said first width having a range of about 0.05 and 0.15 μm said gate, and said gate insulating layer having sidewalls;

g) depositing a second dielectric layer composed of oxide over said sidewalls of said gate, and insulating layer and over said substrate, said second dielectric layer having a thickness in a range of between about 300 and 1200 Å;

h) anisotropically etching said second dielectric layer forming sidewall spacers on the sidewalls of said gate, and said gate insulating layer; said gate insulating layer having a first thickness;

i) removing said gate insulating layer; said sidewall spacers extending above said gate a height of said first thickness; and said sidewall spacers extending horizontally out from said gate a distance of said first width;

j) depositing a metal layer over the resulting surface, said metal layer is composed of a material selected from the group consisting of: titanium, tantalum, and tungsten, and having a thickness in the range of between about 200 and 800 Å;

k) heat treating said metal layer forming a gate silicide contact on said gate, and source and drain silicide contacts on said active areas and leaving unreacted metal over said sidewall spacers, said gate silicide contact and said source and drain silicide contacts having a thickness in the range of between about 400 and 1000 Å;

l) removing said unreacted metal over said sidewall spacers and said field oxide regions; and m) implanting impurity ions in said active areas using said gate as an ion implant barrier forming source and drain regions under said source and drain silicide contacts and doping said top of said gate; said top of said gate is doped and said source and drain regions are formed by ion implanting arsenic ions into said substrate at an energy in the range of between about 40 and 120 keV and a dosage in the range of between about 1E15 and 1E16 atoms/cm$_2$.

16. A method of forming a transistor having sidewall spacers on a gate that extend above and out away from said gate comprising:

a) providing a semiconductor structure having spaced field oxide regions and active areas;
 b) forming a gate structure on said active areas, said gate structure comprising a gate oxide, a gate and a gate insulating layer;
 c) laterally etching said gate to remove a first width of said gate, said gate and said gate insulating layer having sidewalls;
 d) depositing a second dielectric layer over said sidewalls of said gate, and insulating layer and over said substrate; and
 e) anisotropically etching said second dielectric layer forming sidewall spacers on the sidewalls of said gate and said gate insulating layer; said sidewall spacers extending above said gate extending horizontally out from said gate a distance of said first width.

17. The method of claim 16 wherein said first width is in a range of about 0.05 and 0.15 µm and said first dielectric layer has a thickness in a range of between about 800 and 2000 Å.

18. The method of claim 16 which further includes:

f) removing said gate insulating layer; and
 g) forming a gate silicide contact on said gate, and source and drain silicide contacts on said active areas; and forming source and drain regions and doping said gate.

19. A method of forming a transistor where a doped gate, source and drain regions formed after the formation of silicide contacts to said gate, said source and drain regions comprising:

a) providing a semiconductor substrate having spaced field oxide regions and active areas;
 b) forming a gate structure on said active areas, said gate structure comprising a gate oxide, a gate and a gate insulating layer; said gate having a top;
 c) depositing a second dielectric layer composed of oxide over said sidewalls of said gate, and insulating layer and over said substrate,
 d) anisotropically etching said second dielectric layer forming sidewall spacers on the sidewalls of said gate, and said gate insulating layer; said gate insulating layer having a first thickness;
 e) removing said gate insulating layer;
 f) depositing a metal layer over the resulting surface,
 g) heat treating said metal layer forming a gate silicide contact on said gate, and source and drain silicide contacts on said active areas and leaving unreacted metal over said sidewall spacers,
 h) removing said unreacted metal over said sidewall spacers and said field oxide regions; and
 i) implanting impurity ions in said active areas using said gate as an ion implant barrier forming source and drain regions under said source and drain silicide contacts and doping said top of said gate.

20. The method of claim 19 wherein said metal layer is composed of a material selected from the group consisting of; titanium, tantalum, and tungsten, and having a thickness in the range of between about 200 and 800 Å.

21. The method of claim 19 wherein said top of said gate is doped and said source and drain regions are formed by ion implanting arsenic ions into said substrate at an energy in the range of between about 40 and 120 keV and a dosage in the range of between about 1E15 and 1E16 atoms/cm$^2$.

\* \* \* \* \*